(12) United States Patent
Ramasubramanian et al.

(10) Patent No.: US 11,360,147 B2
(45) Date of Patent: Jun. 14, 2022

(54) METHOD OF DETERMINING THE STATE OF CHARGE OF A BATTERY USED IN AN ELECTRIC VEHICLE

(71) Applicant: Karma Automotive LLC, Irvine, CA (US)

(72) Inventors: Suvrat Ramasubramanian, Costa Mesa, CA (US); Ali Jokar, Irvine, CA (US); Jing Hong, Trabuco Canyon, CA (US)

(73) Assignee: Karma Automotive LLC, Irvine, CA (US)

( * ) Notice: Subject to any disclaimer, the term of this patent is extended or adjusted under 35 U.S.C. 154(b) by 137 days.

(21) Appl. No.: 16/808,142

(22) Filed: Mar. 3, 2020

(65) Prior Publication Data

US 2021/0278466 A1    Sep. 9, 2021

(51) Int. Cl.
*G01R 31/367*        (2019.01)
*G01R 31/3835*       (2019.01)

(52) U.S. Cl.
CPC ....... *G01R 31/367* (2019.01); *G01R 31/3835* (2019.01)

(58) Field of Classification Search
CPC .... G01R 31/367; G01R 31/3835; Y02T 10/70
See application file for complete search history.

(56) References Cited

U.S. PATENT DOCUMENTS

| 7,233,128 | B2 | 6/2007 | Brost et al. |
| 9,329,240 | B2 | 5/2016 | Baba et al. |
| 2014/0210418 | A1* | 7/2014 | Wang ............... H02J 7/00 320/134 |
| 2014/0214348 | A1 | 7/2014 | Sahinoglu et al. |
| 2015/0142226 | A1* | 5/2015 | Jung ............... B61L 27/00 701/20 |
| 2015/0287222 | A1* | 10/2015 | Zhao ............... G01R 33/5619 382/131 |
| 2019/0064276 | A1 | 2/2019 | Kawai et al. |
| 2019/0170827 | A1 | 6/2019 | Shoa Hassani Lashidani |
| 2019/0339333 | A1 | 11/2019 | Gelso et al. |

FOREIGN PATENT DOCUMENTS

| CN | 104573294 A | * | 4/2015 |
| CN | 111505506 A | * | 8/2020 |
| JP | 2018-077199 A |   | 5/2018 |

(Continued)

OTHER PUBLICATIONS

Ma et al., State of Charge Estimation of Lithium Ion Battery Based on Adaptive Kalman Filter Method for an Equivalent Circuit Model, Applied Sciences, Jul. 9, 2019, p. 1-14.*

(Continued)

*Primary Examiner* — Stacy Whitmore
(74) *Attorney, Agent, or Firm* — Honigman LLP

(57) ABSTRACT

A method of determining the state of charge (SOC) of a battery. The method may employ a transformation technique that linearizes a nonlinear model by converging close to a measured value and thereby estimating the state of charge accurately without affecting the computation time and load on the system. The transformation technique employs an adaptive unscented Kalman filter (UKF).

3 Claims, 4 Drawing Sheets

(56) References Cited

FOREIGN PATENT DOCUMENTS

KR    10-2019-0140268 A    12/2019

OTHER PUBLICATIONS

CN 110596593 A, Dec. 20, 2019 pp. 1-9.*
Eric A. Wan et al; "The Unscented Kalman Filter for Nonlinear Estimation"; Oregon Graduate Institute of Science & Technology; National Science Foundation; Grant No. IRI-9712346; (2013, cited at class syllabus https://www.seas.harvard.edu/courses/cs281/).
International Search Report and Written Opinion dated Jun. 24, 2021 issued by the Korean Intellectual Property Office in related International Application No. PCT/US2021/020652; filed Mar. 3, 2021.

* cited by examiner

METHOD OF DETERMINING THE STATE OF CHARGE OF A BATTERY USED IN AN ELECTRIC VEHICLE

BACKGROUND

The present disclosure relates to a method for determining the state of charge of a battery.

Batteries are used as the source of energy for many electrical systems, especially in hybrid electric vehicles (HEVs) and electric vehicles (EVs). In these vehicles, the battery interacts with other components by means of a Battery Management System (BMS) to provide power to the vehicle and meet the vehicle's energy demand while maintaining the safety of the electrical system. The battery is typically a high voltage (HV) battery. Plug-in Hybrid Electric Vehicles (PHEV, HEV) and full electric vehicles depend on the battery as a secondary and primary source of energy, respectively, to propel the vehicle. Therefore, it is imperative to track the available energy from the battery to prevent the battery from overcharging or under discharging. To ensure a safe and maximum utilization of the available energy from the battery, such vehicles employ a BMS that controls the functioning of the battery and determines its performance.

The reliability of these electrical systems is highly dependent of the health and safety of the battery, and therefore on the ability of the BMS to provide operation data that allows for peak performance without jeopardizing the health and safety of the battery. Controlling and monitoring a battery installed in an HEV or EV is much more challenging without a fast and accurate model of the battery to be used by the BMS. Models are used for estimating metrics of the battery, including state-of-charge (SOC), state-of-health (SOH), state-of-energy (SOE) and state-of-power (SOP). Also, the models are employed to help BMSs with the functions of battery control, real-time observation, parameter estimation, and optimization of the battery.

The State of Charge (SOC) gives a measure of the remaining usable capacity of the battery in real time as the battery is charged through external charging or regen mechanism and discharged during driving. The SOC determines the capability of the battery to provide the required energy and accurate estimation of the SOC prevents the degradation of the battery as a result of excess charge and discharge. Typically, the SOC is the ratio of the current battery capacity to the maximum batter capacity.

It is important that the BMS accurately determine the battery state of charge in real time. By doing so, the BMS can ensure maximum performance output from the battery while minimizing effects that shorten of life of the battery.

The BMS should be able to estimate the state of charge of the battery in any given condition. If the SOC determined by the BMS is inaccurate, for example, if the SOC is underestimated, this may result in overcharge of the battery. The overcharging of the battery could create dangerous events such as thermal runaway of the battery. On the other hand, if the SOC is overestimated, the overall capability of the battery will be limited thereby affecting the performance and allowing for less energy to be drawn from the battery.

The typical method of determining the SOC is based on the integral of the current over a period, times the inverse of the remaining capacity of the battery. Other methods of determining the SOC use the estimation technique such as Kalman filters, extended Kalman filter (EKF) suffer from limitations due to estimating the non-linear behavior of the battery (KF) and/or inaccuracies due to the linearization methodology employed (EKF). Furthermore, advanced methods such as learning algorithms (e.g., machine learning, neural networks) have high computational complexity that cannot be applied in real time for estimation of the SOC.

It would be desirable to find a method of determining the SOC that including using a non-linear data modeling and providing updates in real time.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

As used herein, vector notations are defined as follows:

$$\dot{x} = \frac{\partial}{\partial t} x$$

$$\hat{x} = \text{mean}(x)$$

$$\tilde{x} = \text{mean}(x)$$

Reference throughout this document to "one embodiment," "certain embodiments," "an embodiment," or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
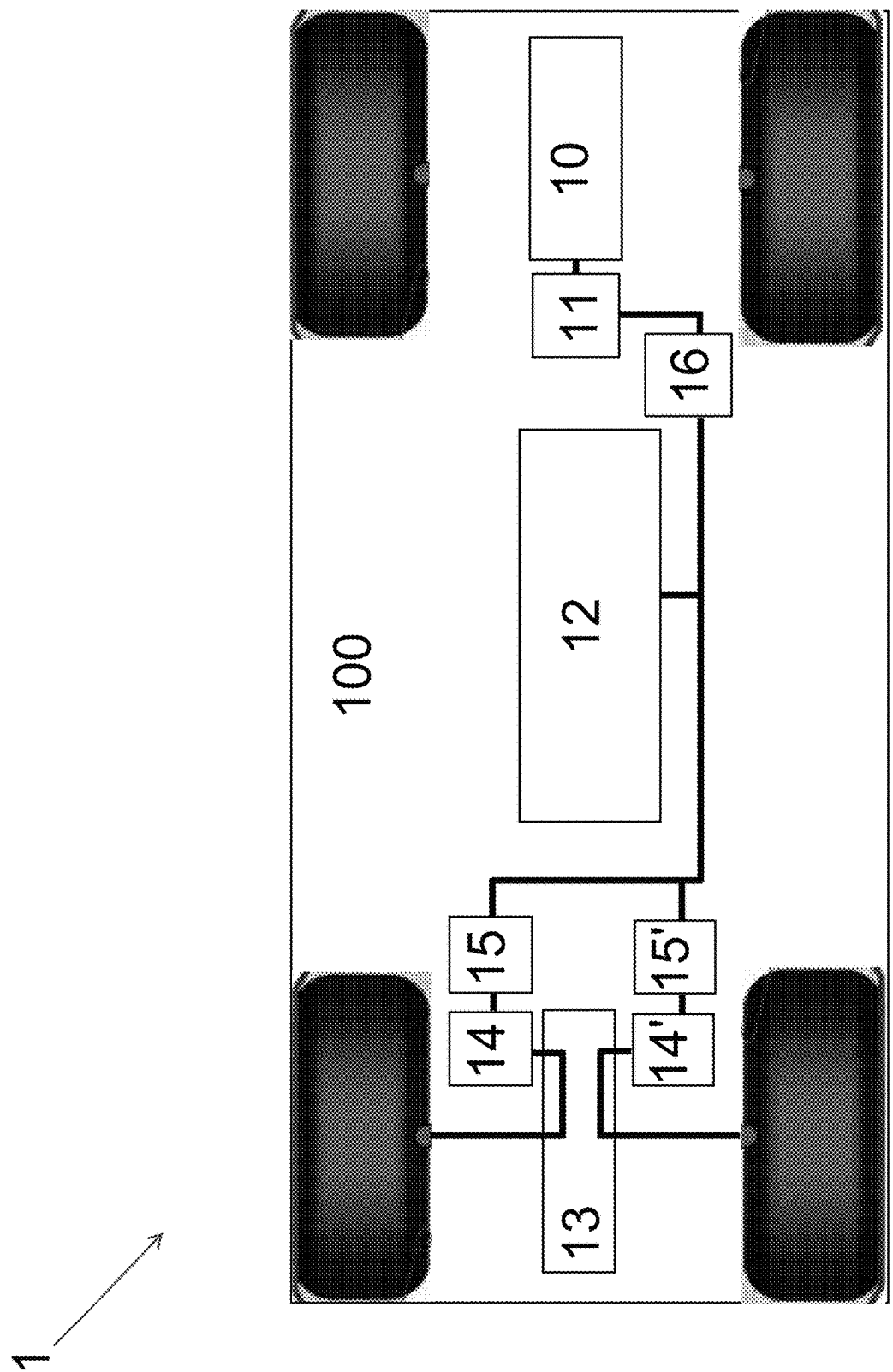
FIG. 1 is an electric vehicle with an exemplary drivetrain including a battery.

FIG. 1 shows an exemplary electric vehicle 1 with a drivetrain 100. The exemplary vehicle includes an internal combustion engine 10, a generator 11, and one or more electric motors for driving rotation of the wheels of the vehicle. The internal combustion engine 10 drives the generator 11 to produce electrical power for a battery 12 and the motors 14/14'. A generator inverter 16 for the generator 11 may also be provided. A gearbox 13 is provided to provide the required drive ratio for the vehicle. Power to the motor is communicated via inverters 15/15', which transforms DC power provided to the AC power required by the motors 14/14'. The inverters 15/15' may include multiple phases corresponding to each phase of the motors 14/14'. The system and method described below may be used in conjunction with a battery such as the battery 12 shown in FIG. 1.

Figure 2:
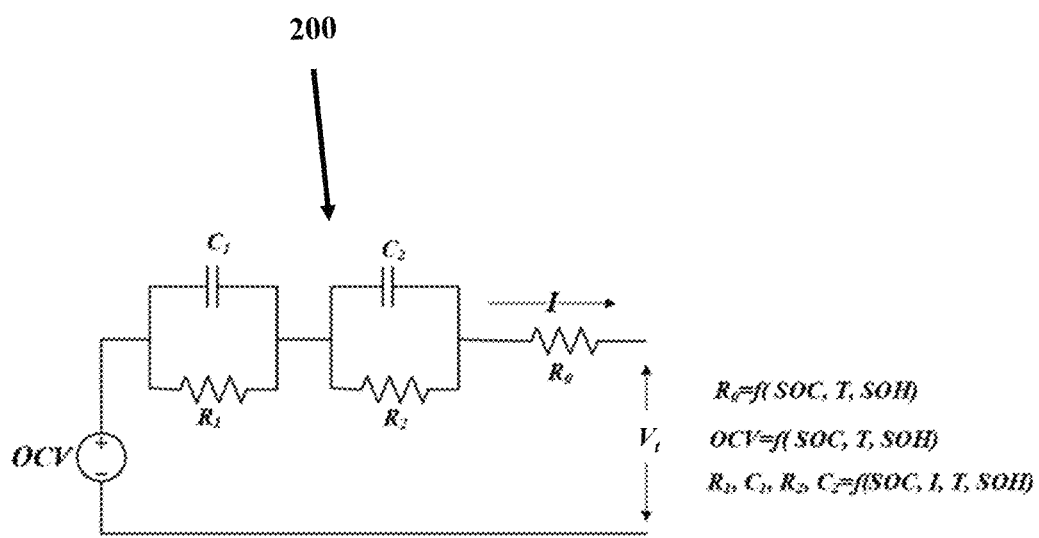
FIG. 2 is a simplified circuit diagram of an exemplary embodiment of a two branch RC model equivalent circuit for a battery.

In one embodiment, the estimation method of determining the SOC uses the battery parameters based on a $2^{nd}$-order RC equivalent circuit model of the battery (e.g., as shown in FIG. 2) and estimates the voltage based on the circuit model. FIG. 2 is a circuit diagram depicting an exemplary embodiment of a RC model 200 for use in the SOC estimation method 300. In one embodiment, all RC parameters (including but not limited to $R_0$, $C_1$, $R_1$, $C_2$, $R_2$, and Open Circuit Voltage (OCV)) may be generated by fitting the parameter with data obtained from tests performed on the battery cell 215. In one embodiment, $R_0$ is determined as a function of the state of charge (SOC) of the battery cell 215, the battery cell 215 temperature $T_{cell}$, and the state of health (SOH) of the battery cell 215. In one embodiment, OCV is determined as a function of the state of charge (SOC) of the battery cell 215, the battery cell 215 temperature $T_{cell}$, and the state of health (SOH) of the battery cell 200. In one embodiment, $C_1$, $R_1$, $C_2$, and $R_2$ are determined as a function of the state of charge (SOC) of the battery cell 215, the equivalent circuit current I, the battery cell 215 temperature $T_{cell}$, and the state of health (SOH) of the battery cell 200.

Figure 3:
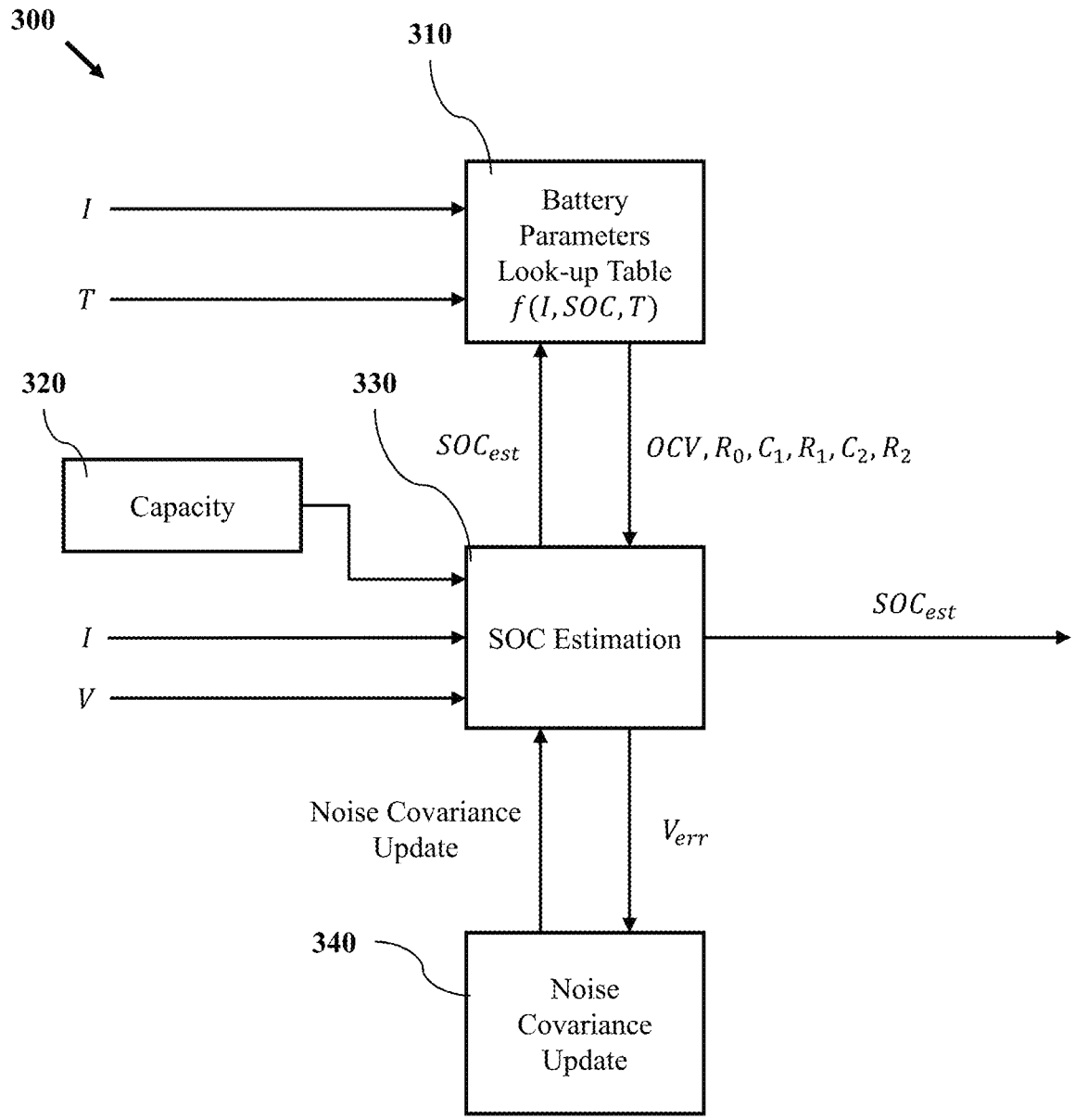
FIG. 3 is a block diagram of a Battery Management System that includes a controller and a plurality of modules for carrying out a method of estimating the state of charge of a battery.

FIG. 3 is a block diagram of a plurality of modules that may be employed in the BMS 300 for carrying out the method of determining or estimating the SOC for a vehicle battery. The system includes a controller that includes a SOC estimation module 330. The system also includes look up tables for various battery parameters that may be created and stored in a Lookup Table module 310. The system may further include a module 320 for estimating or determining the remaining capacity of the battery based on the SOH of the battery. Further, the system includes a module 340 for performing a Noise Covariance Update of the SOC estimation. Where the term covariance refers to the joint variability of two or more random variables.

The aforementioned modules may be integrated into a single controller or microprocessor. Alternatively, one or more of the modules may be packaged separately in one or more microprocessor or controller.

The system is configured to make a probabilistic determination or estimation of the state of charge (SOC) based on the innovation sequence (the difference between the observed value of a variable and the optimal forecast of that value based on prior information) given by the voltage estimation error and corrects the SOC calculated by the model equation. The method of determining the SOC involves two "update" steps for estimating the battery voltage and determining the SOC. The first update step is a measurement update, where the model predicts the state of charge and battery voltage based on the variance of the estimated value from the true value. The second update step is a time update of the prediction based on the innovation error computed from the voltage estimation error to correct the predicted state of charge.

The method of determining the SOC may employ a transformation technique that linearizes the nonlinear model used in this method by converging close to the measured value and thereby estimating the state of charge accurately without affecting the computation time and load on the system. The transformation technique employs an adaptive unscented Kalman filter (UKF) based on a technique called the unscented transform for linearizing the nonlinear model equation, wherein an initial point determines the probability of the convergence of the estimation.

Additionally, the method for determining the SOC may employ a methodology known as a normalized innovation sequence (NIS) to update the noise covariance matrix that measures the deviation of the estimate due to additive noise that may not be Gaussian in nature (whereas UKF assumes that the noise present in the system is Gaussian). The use of the NIS enables the model of the battery capacity to adapt to the changing noise covariance and update the state vector.

The estimation method of determining the SOC additionally updates the noise covariance of the estimated states by adapting to the estimation error (known as "innovation sequence") based on the moving average error method. The update ensures that the method is robust and estimates the state (i.e., the SOC) accurately.

Figure 4:
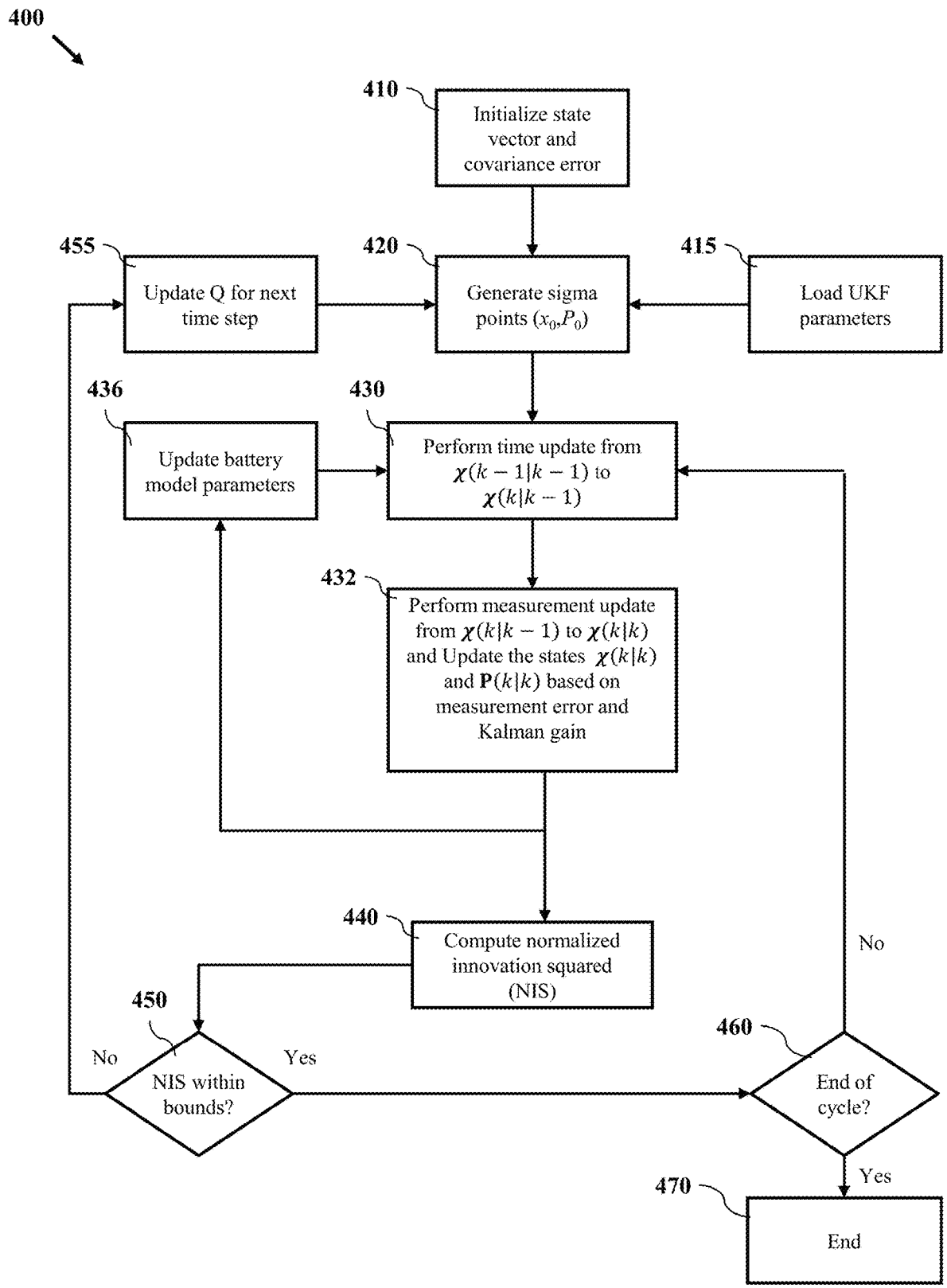
FIG. 4 is a flow chart of the method performed by the controller and modules of FIG. 3.

FIG. 4 shows a flow chart of a method of estimation the SOC performed by the BMS 300 system show in simplified form in FIG. 3. As a first step of the method the system establishes an initial value of the SOC and of a covariance error Q in step 410.

In step 420, the method generates updated sigma points for the SOC ($x_0$) and the covariance ($P_0$). The updates are generated using the following equations.

$$\hat{x}_0 = E[x_0]$$

$$P_0 = E[(x_0 - \hat{x}_0)(x_0 - \hat{x}_0)^T] \forall k \in \{1, \ldots, \infty\}$$

In step 430 the system performs a time update of the sigma points using the following equation.

$$\chi_{k-1} = [\hat{x}_{k-1}(\hat{x}_{k-1} + \gamma\sqrt{P_{k-1}})(\hat{x}_{k-1} - \gamma\sqrt{P_{k-1}})]$$

where $E[x_0]$ is the expected value of $x_0$; $\gamma = \sqrt{n+\lambda}$; $\lambda = \alpha^2 (L+\kappa) - L$; $\alpha$, $\kappa$ are the scaling parameters; $L = 2n+1$ sigma points; and n is number of state variables (in the primary embodiment, n=3).

$$\dot{\chi}_k = f(\chi_{k-1}, u_k) \quad (1)$$

$$y_k = V_{ocv,k}(SOC_k, T_k) + V_{rc1,k} + V_{rc2,k} + I_k R_{0,k} \quad (2)$$

where equation (1) is the state space equation which consists of equations for each state variable and using $\chi_{k-1}$ as sigma points at the previous time step, $y_k$ is the predicted voltage, $u_k$ is the control vector representing data measurements taken at time k, $V_{ocv,k}$ is determined from a lookup table, $R_{0,k}$ is a function of SOC, temperature and current and where f determines the updated values for $\dot{\chi}_k$ as follows:

$$\hat{x}_k = [SOC_k, V_{rc1,k}, V_{rc2,k}]$$

$$u_k = \left[\frac{I_k \Delta t}{Ah * 3600}, I_k R_1 * \left(1 - e^{\frac{-\Delta t}{\tau_1}}\right), I_k R_2 * \left(1 - e^{\frac{-\Delta t}{\tau_2}}\right)\right]$$

-continued $$SOC_k = SOC_{k-1} + \frac{I_k \Delta t}{Ah * 3600}$$

$$V_{rc1,k} = V_{rc1,k-1} * \left(e^{\frac{-\Delta t}{\tau_1}}\right) + I_k R_1 * \left(1 - e^{\frac{-\Delta t}{\tau_1}}\right)$$

$$V_{rc2,k} = V_{rc2,k-1} * \left(e^{\frac{-\Delta t}{\tau_2}}\right) + I_k R_2 * \left(1 - e^{\frac{-\Delta t}{\tau_2}}\right)$$

where time constant $\tau_1 = R_1 * C_1$, time constant $\tau_2 = R_2 * C_2$, and all the RC parameters are input from the RC model lookup tables and Ah is the battery cell capacity. Equation (1) predicts the change in value $\chi_k$ for each sigma point $\chi_k$ at next time step as a function of the sigma points computed on states at current time step, acting on the input at current time step. Equation (2) is the output equation which is the equation for estimated voltage, which is then used for updating the estimated state variables.

It should be noted that, as shown in block 415, that the system is configured to generate the sigma points based on the UKF parameters (e.g., alpha, beta, gamma, Weights (W_c, W_m)).

In step 432, the system is configured to perform a measurement update and update the states based on the measurement error and Kalman gain using the following equation:

$$\tilde{x}_k = \hat{x}_k + K(V_{measured} - y_k)$$

where $\tilde{x}_k$ is the corrected state, K is the Kalman gain (a weight function ranging between 0 and 1 indicating how much weight to assign to a predicted value versus a measured value) and $V_{measured}$ is the cell voltage measured by a sensor.

In step 440, the update of the covariance matrix is made based on the innovation sequence of the system which is otherwise known as the error e in the voltage prediction. As shown in FIG. 3, the module 340 performs a consistency check of a NIS sequence as described below. The consistency check utilizes the following equations:

$$e = V_{measured} - y_k$$

$$Q_{process} = KE[ee^T]K^T$$

where $Q_{process}$ is the covariance of the process noise.

The measurement error is squared and normalized to give a sequence which is used to check for the consistency of the determination of the SOC made by the controller. In step 440, this sequence is known as normalized innovation squared (NIS) and is given by, $$NIS_k = e_k S_k^{-1} e_k^T$$

where k is the time step, e is the error and S is the measurement error variance. An exemplary time step would 1 second. The NIS plot follows chi-squared distribution with zero mean and variance a. In one embodiment, the consistency check is performed by checking whether the NIS sequence lies within a confidence bound which is computed as, $$\frac{(n-1)\sigma^2}{\chi^2_{n,1-\alpha}} < NIS < \frac{(n-1)\sigma^2}{\chi^2_{n,\alpha}},$$

where $\sigma^2$ is the standard deviation of the NIS sequence, n−1=d.o.f. (degrees of freedom) of the chi-squared distribution, and $\chi^2_{1-\alpha}$ is the chosen chi value (unrelated to the $\chi$ sigma points) for the confidence % $\alpha$.

In step 450, the system is configured to check if NIS is within accepted confidence bounds (step 450) and, if NIS is not within the confidence bounds, then the module 340 is configured to update Q for the next time step as shown in step 455 of FIG. 4.

If the cycle is complete (see step 460) then the system is configured to end the process.

While this disclosure has been particularly shown and described with references to exemplary embodiments thereof, it will be understood by those skilled in the art that various changes in form and details may be made therein without departing from the scope of the claimed embodiments.

The following list is a non-limiting summary of the variables mentioned above, wherein state refers to the SOC:

$x_0$: initial state
$\hat{x}_0$: initial state (best estimate)
$P_0$: initial covariance matrix
k−1: current step
k: next step in time
$\hat{x}_{k-1}$: current state (best estimate)
$P_{k-1}$: current covariance matrix
$\chi_{k-1}$: sigma points (current step)
$\lambda$: sigma point scaling parameter
$\alpha$: sigma point scaling parameter, spread of sigma points around $\hat{x}$
$\kappa$: sigma point scaling parameter
L: number of sigma points
n: number of states
$\hat{x}_k$: next state (best estimate)
$\tilde{x}_k$: mean of state
$\chi_k$: sigma points
$y_k$: predicted voltage
$V_{measured}$: cell voltage measured by sensor
K: Kalman gain
e: error in voltage prediction
$Q_{process}$: process noise covariance matrix
$S_k$: measurement error variance
$NIS_k$: normalized innovation squared
$V_{ocv,k}$: open circuit voltage of RC model
$I_k$: current of RC model
$R_{0,k}$: resistance of RC model (elements outside the RC parallel circuit sections)
$R_{1,k}$: resistance of RC model ($1^{st}$ RC parallel circuit section)
$R_{2,k}$: resistance of RC model ($2^{nd}$ RC parallel circuit section)
$C_{1,k}$: capacitance of RC model ($1^{st}$ RC parallel circuit section)
$C_{2,k}$: capacitance of RC model ($2^{nd}$ RC parallel circuit section)
$V_{rc1,k}$: voltage of RC model ($1^{st}$ RC parallel circuit section)
$V_{rc2,k}$: voltage of RC model ($2^{nd}$ RC parallel circuit section)
$\tau_1$: time constant ($1^{st}$ RC parallel circuit section, $x_1 = R_1 * C_1$)
$\sigma^2$: variance of the sequence
$\chi^2_{1-\alpha}$: chi value for the confidence % $\alpha$

What is claimed is:

1. A method of determining the state of charge (SOC) of a battery used to provide power for propulsion of an electric vehicle comprising the steps of:
   establishing an initial value for the SOC and a noise covariance error;
   generating updated sigma points for a best estimate of the SOC and a noise covariance error matrix;

determining the SOC based on a nonlinear battery model that is updated over a predetermined time interval, wherein the method includes linearizing the nonlinear model into a linear model using an unscented Kalman filter and wherein the determination of the SOC is based on a measurement error of battery voltage and a gain of the unscented Kalman filter;

computing an update of the covariance error matrix based on an innovation sequence related to an error associated with predicting battery voltage, wherein the innovation sequence is a sequence known as normalized innovation squared (NIS) sequence;

performing a consistency check of the NIS sequence by checking whether the NIS sequence lies within a predetermined confidence bounds;

updating the covariance error if the consistency check of the NIS sequence determines that the NIS sequence lies outside of the confidence bounds; and repeating the aforementioned steps after the predetermined time interval has elapsed.

2. The method of claim 1, wherein the method uses battery parameters based on two branch RC model for performance of the battery.

3. A method of determining the state of charge (SOC) of a battery used to provide power for propulsion of an electric vehicle comprising the steps of:

establishing an initial value for the SOC and a noise covariance error;

generating updated sigma points for a best estimate of the SOC and a noise covariance error matrix;

determining the SOC based on a nonlinear battery model that is updated over a predetermined time interval, wherein the method includes linearizing the nonlinear model into a linear model using an unscented Kalman filter and wherein the determination of the SOC is based on a measurement error of battery voltage and a gain of the unscented Kalman filter;

computing an update of the covariance error matrix based on an innovation sequence related to an error associated with predicting battery voltage, wherein the innovation sequence is a sequence known as normalized innovation squared (NIS) sequence;

wherein the innovation squared (NIS) sequence is calculated by $$NIS_k = e_k S_k^{-1} e_k^T$$

where k is the time step, e is the error and S is the measurement error variance and wherein $e = V_{measured} - y_k$ where V_measured is the voltage measured and y_k is the predicted voltage;

performing a consistency check of the NIS sequence by checking whether the NIS sequence lies within a predetermined confidence bounds;

updating the covariance error if the consistency check of the NIS sequence determines that the NIS sequence lies outside of the confidence bounds; and repeating the aforementioned steps after the predetermined time interval has elapsed.

* * * * *